United States Patent
Suzuki et al.

(10) Patent No.: US 6,493,228 B1
(45) Date of Patent: Dec. 10, 2002

(54) HEAT RADIATION PACKAGING STRUCTURE FOR AN ELECTRIC PART AND PACKAGING METHOD THEREOF

(75) Inventors: Masataka Suzuki, Shizuoka-ken (JP); Hirotoshi Oda, Shizuoka-ken (JP); Hisafumi Maruo, Shizuoka-ken (JP); Hiroyuki Ashiya, Shizuoka-ken (JP); Yasutaka Nagaoka, Shizuoka-ken (JP); Yayoi Maki, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/705,831

(22) Filed: Nov. 6, 2000

(30) Foreign Application Priority Data

Nov. 11, 1999 (JP) .............................. 11-321380

(51) Int. Cl.[7] ................................ H05K 7/20
(52) U.S. Cl. ....................... 361/704; 361/705; 361/707; 361/719; 251/687; 251/706; 251/709; 174/50.51; 174/52.2; 165/80.2; 165/185
(58) Field of Search ................... 361/704, 705, 361/707, 712–714, 717–720; 257/675, 687, 706, 707, 712, 796; 174/16.3, 50.5, 50.51, 50.52, 50.54, 52.2, 52.3; 165/80.2, 185

(56) References Cited

U.S. PATENT DOCUMENTS

| | | | | |
|---|---|---|---|---|
| 3,501,582 A | * | 3/1970 | Heidler et al. ............. | 174/52.2 |
| 4,707,763 A | * | 11/1987 | Kudo ......................... | 361/720 |
| 4,849,803 A | * | 7/1989 | Yamamoto et al. ......... | 257/687 |
| 5,060,114 A | * | 10/1991 | Feinberg et al. ............ | 361/706 |
| 5,208,733 A | | 5/1993 | Besanger | |
| 5,625,536 A | * | 4/1997 | Soyano et al. ............... | 361/736 |
| 5,792,984 A | * | 8/1998 | Bloom ........................ | 174/52.3 |
| 6,201,696 B1 | * | 3/2001 | Shimizu et al. .............. | 361/704 |

FOREIGN PATENT DOCUMENTS

| | | | | |
|---|---|---|---|---|
| GB | 2 256 531 | 12/1992 | | |
| JP | 11-40035 | 2/1999 | | |
| JP | 11-220264 | 8/1999 | | |
| JP | 11-289180 | 10/1999 | | |
| JP | 11289180 A | * 10/1999 | ............ | H05K/7/20 |
| JP | 2000-307277 | 11/2000 | | |

OTHER PUBLICATIONS

UK Search Report, Appln. No. 0027177.5.

* cited by examiner

*Primary Examiner*—Boris Chervinsky
(74) *Attorney, Agent, or Firm*—Finnegan, Henderson, Farabow, Garrett, & Dunner L.L.P.

(57) ABSTRACT

A heat radiation packaging structure without getting a board itself larger, but with an excellent heat radiation ability and a low cost is provided. A bus bar 12 is fixed onto a wiring board 11, a connecting lead 15A of a relay 15 etc. being joined onto the bus bar 12, and the wiring board 11, the bus bar 12 and the relay 15 etc. are sealed all together with a heat conduction resin 23.

Additionally, the bus bar 12 comprises a thermal diffusion portion 17 which is bent via a bent portion 12B and is apart from the wiring board 11. By means of such a structure, a heat radiation ability is enhanced and the heat radiation packaging structure for an electric part is realized at low cost without getting a board itself larger.

14 Claims, 4 Drawing Sheets

HEAT RADIATION PACKAGING STRUCTURE FOR AN ELECTRIC PART AND PACKAGING METHOD THEREOF

BACKGROUND OF THE INVENTION

The present invention relates to a heat radiation packaging structure for an exothermic electric part e.g. a relay etc. and a packaging method thereof.

Conventionally, degradation of soldered joints has been predominant in the case of mounting a large current electric part such as a relay onto a board using an ordinary eutectic solder, because of the large amount of heat generated by the electric part.

Therefore, a large current electric part has been mounted by soldering it on a electric wiring conductor coated with a resin mold, and by using a high melting point solder or by providing a heat radiation plate especially when an ordinary board may be used. As an exemplification, Japanese Patent Provisional Publication No. 11-40035/1999 discloses a connection structure for an electric part relating to a relay built-in controller. As shown in FIG. 1, a lead frame 1 comprising a metallic plate is used as a wiring conductor for a packaging board. In this prior technology, resin plates 2, 3 are disposed to sandwich the lead frame 1 therebetween.

Further, extruded portions 4 protruding downward almost cylindrically are disposed at the prescribed positions on the lead frame in order to pierce the resin plate 3. As shown in FIG. 2, a terminal 5A of a relay 5, for example, is inserted into the extruded portion 4 down from the upper surface of the resin plate 2, and is joined by filling a solder 6 in the extruded portion 4.

However, in the connection structure for an electric part according to said prior technology, since it is necessary to form the resin plates 2, 3 on the top and bottom surfaces respectively of the lead frame 1 in order to avoid adhering of resin onto the extruded portions, there has been the problems of making a manufacturing process complicated and resulting in a high cost of a product.

Further, since said prior technology includes the structure wherein the both sides of the lead frame 1 are covered with the resin plates 2, 3, there has been the problem of a decrease in a heat radiation ability.

Besides, when such a highly exothermic large current electric part is mounted on an ordinary printed wiring board, it becomes necessary to join them together with a high melting point solder or a high endurance solder and further to use an expensive printed wiring board comprising a board material with low thermal expansion.

Therefore, it has been necessary to make a board larger in dimension in order to maintain heat radiation using a wiring board consisting of the ordinary board material. Further, when such a packaging board is, for example, a board for a relay built-in on-vehicle controller, getting larger in size and area of the board itself may turn to be a cause which interferes getting an engine room smaller in volume.

SUMMARY OF THE INVENTION

Accordingly, the present invention aims to provide a heat radiation packaging structure for an electric part which does not cause getting a board itself larger in size, being excellent in heat radiation and low at cost, and to provide a method packaging of the electric part.

The 1st invention is a heat radiation packaging structure for an electric part, wherein a bus bar is fixed to a wiring board, joining a connecting terminal of an exothermic electric part onto the bus bar, sealing said wiring board, said bus bar, and said electric part with a heat conduction resin.

Therefore, since the heat generated from the exothermic electric part is directly conducted to the heat conduction resin in contact with the surface of the electric part and is then radiated outward, and is also conducted through the bus bar via a contact surface between the electric part and the bus bar, and is then radiated outward after conducting through the heat conduction resin in contact with the surface of the bus bar, an efficient heat radiation can be achieved. Moreover, since the heat conducted to the wiring board through the bus bar is also efficiently radiated from the heat radiating resin, the functions to restrain thermal degradation of the electric part and joint degradation of connected portion between the electric part and the bus bar can be provided.

Additionally, according to the 1st invention, it can be restrained for the wiring board to get larger because of an enhanced heat radiating ability using the heat conduction resin. Further, the functions to enhance humidity resistance and electrical insulation can also be provided by means of sealing the whole electric part with the heat conduction resin.

Besides, the 2nd invention is the heat radiation packaging structure for an electric part according to the 1st invention, wherein said bus bar includes a thermal diffusion portion which is bent up apart from said wiring board by means of a bent portion.

According to 2nd invention, since the thermal diffusion portion shaped by bending so as to be apart from the wiring board contacts the heat conduction resin on both the surfaces, an area of heat radiation can be increased and the ability in heat radiation can be enhanced.

Further, the 3rd invention is the heat radiation packaging structure for an electric part according to the 2nd invention as described above, wherein the bent portion of said bus bar contacts a side of said electric part. Therefore, according to 3rd invention, since the bent portion contacts the side of the electric part, the heat generated from the electric part can be well conducted toward the bus bar, restraining the electric part to increase greatly in temperature.

Besides, the 4th invention is the heat radiation packaging structure for an electric part according to any of the 1st–3rd invention as described above, wherein said heat conduction resin is contained in an outer case having a better heat radiation characteristic. According to the 4th invention, the heat stored in the heat conduction resin can be well radiated outward from the outer case.

DESCRIPTION OF THE PREFERRED EMBODIMENT

Figure 1:
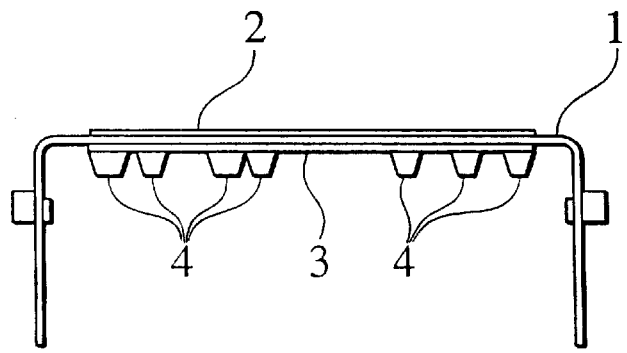
FIG. 1 is a side view showing a wiring board of the prior art.
Figure 2:
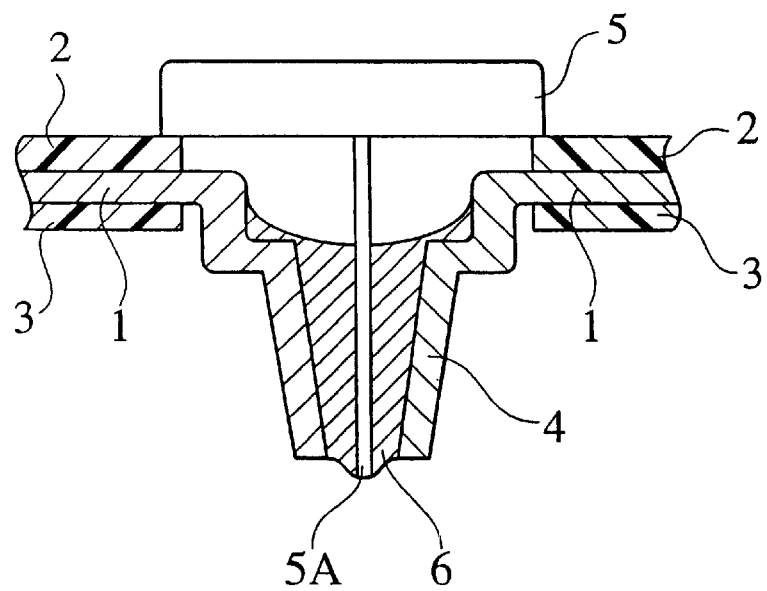
FIG. 2 is a sectional view of the main portion showing a connection structure of an electric part according to the prior art.

In the following, a heat radiation packaging structure for an electric part and a method of packaging the electric part in accordance with the present invention will be described in detail according to the embodiments shown in the drawings.

Figure 3:
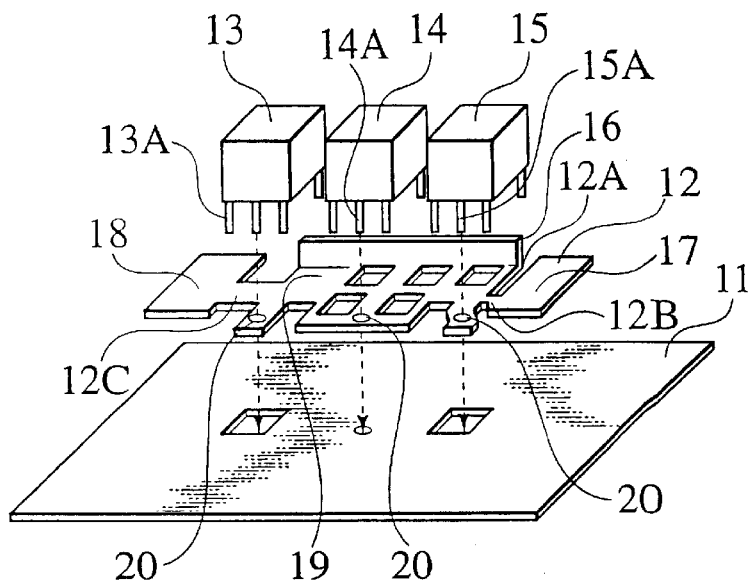
FIG. 3 is a perspective view showing a manufacturing step in an embodiment of a packaging method of an electric part according to the present invention.
Figure 4:
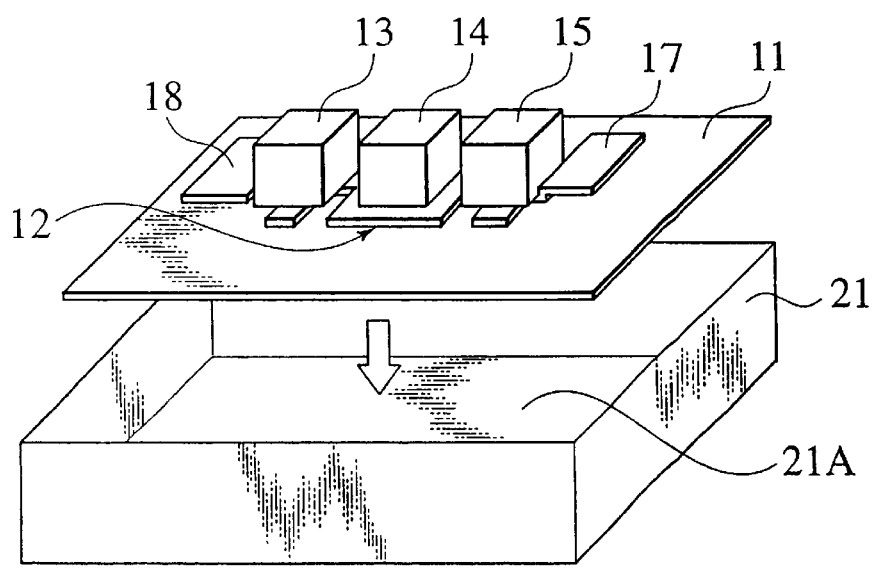
FIG. 4 is a perspective view showing a step in the present embodiment.
Figure 5:
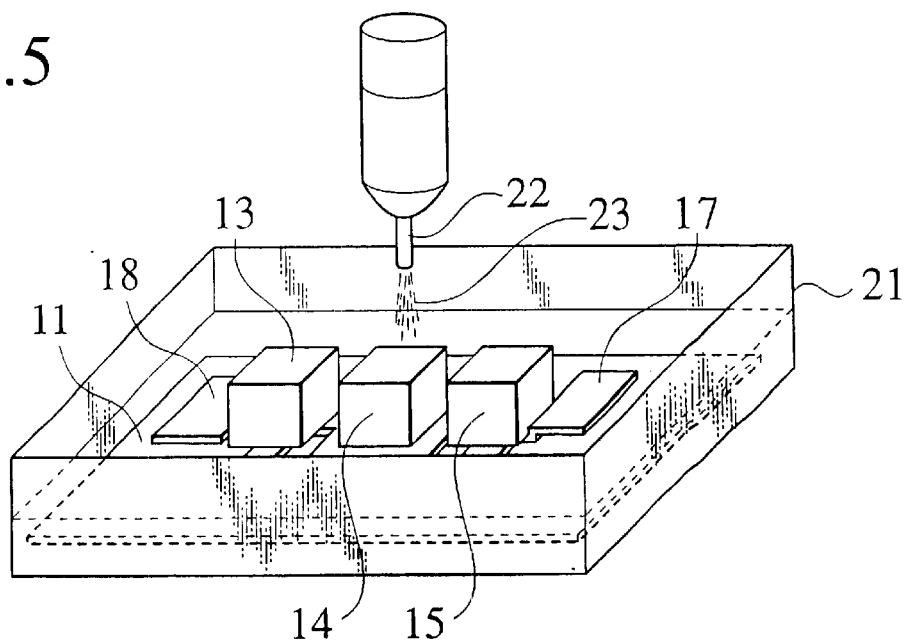
FIG. 5 is a perspective view showing a step in the present embodiment.
Figure 6:
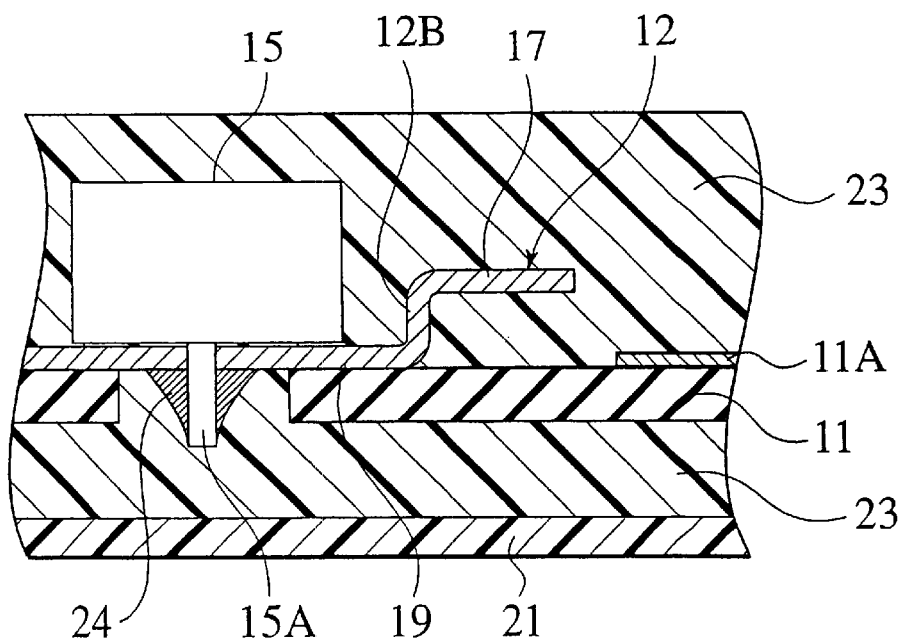
FIG. 6 is a sectional view of the main portion showing a heat radiation packaging structure in the present embodiment.

FIG. 3–FIG. 5 are the perspective views showing the embodiment of a packaging method of electric parts in accordance with the present invention. FIG. 6 is the sectional view of the main portion showing a heat radiation packaging structure in the present embodiment.

In the first place, the packaging method of electric parts according to the present embodiment is described. As shown in FIG. 3, a bus bar 12 is fixed onto a wiring board 11, and relays 13, 14, 15 as an example for an exothermic electric part are soldered onto the bus bar 12.

The wiring board 11 is composed of glass-epoxy as a board material, and the wiring patterns (not shown in FIG. 3) for mounting some electric parts except relays 13, 14, 15 are formed properly. Further, the wiring patterns are disposed on the wiring board excepting the region where the bus bar 12 is to be mounted.

The bus bar 12 is made by working a metallic plate into a prescribed pattern, and is formed into a shape corresponding to the connecting patterns of the relays 13, 14, 15. Further, the bus bar 12 is shaped so as to contact the relays 13, 14, 15 as far as it does not electrically interfere with the other portions of them.

In more detail, as shown in FIG. 3, the bus bar 12 has bent portions 12A, 12B, 12C around the regions where the relays 13, 14, 15 are to be disposed, and by bending an outer portion of these bent portions 12A, 12B, 12C the bus bar 12 is designed so as to contact the sides of the relays 13, 14, 15. The outer portion 16 of the bent portion 12A is formed to extend so as to contact the sides of the relays 13, 14, 15.

Besides, thermal diffusion portions 17, 18 formed outside the bent portions 12B, 12C are designed so as to be above the wiring board 11 and parallel thereto. Still in FIG. 3, the bent portions 12B, 12C before bending work are shown. An inner portion 19 inside these bent portions 12A, 12B, 12C is shaped like a flat plate so as to be coherently fixed to the wiring board 11.

Further, at the prescribed positions of the bus bar 12, as shown in FIG. 3, joint holes 20 are formed for inserting each of connecting leads 13A, 14A, 15A of the relays 13, 14, 15 respectively. The connecting leads 13A, 14A, 15A inserted in the joint holes 20 are soldered onto a bottom surface of the bus bar 12. Besides, the other connecting leads of the relays 13, 14, 15 are appropriately joined to the wiring patterns, not shown in the Figure, formed on the wiring board 11.

FIG. 4 shows a situation where the bending-worked bus bar 12 and the relays 13, 14, 15 are mounted onto the wiring board 11. Then, the wiring board 11 thus mounted is, as shown in FIG. 4, put into an outer case 21.

The outer case 21 has a slightly larger storage space than a plan profile of the wiring board 11. Moreover, when the wiring board 11 is put into the outer case 21, a spacer material (omitted in the Figure), for example, is interposed so as to position a bottom surface of the wiring board 11 above a bottom plate 21A of the outer case 21. Further, wiring leads etc. to be connected onto the wiring board 11 are appropriately drawn out of the outer case 21.

Then, as shown in FIG. 5, at the situation where the wiring board 11 is put in the outer case 21, a heat conduction resin 23 for heat radiation with good thermal conductivity is discharged from a resin supply nozzle 22 disposed above the outer case 21, filling up the outer case 21 with the heat conduction/radiation resin 23, and a packaging process of the electric parts according to the present embodiment is then completed after curing the heat conduction resin 23.

As a result, as shown in FIG. 6 illustrating a sectional view of the main portion, each relay 13, 14, 15 (the relay 15 is only shown in FIG. 6) is wholly sealed with the heat conduction resin 23, and the bus bar 12 joined and contacted with each relay 13, 14, 15 is also sealed with the heat conduction resin. Moreover, the bottom surface of the wiring board 11 is also sealed contacting coherently to the heat conduction resin 23. Further, thermal diffusion portions 16, 17, 18 outside the bent portions 12A, 12B, 12C of the bus bar 12 are sealed in such a condition that they are apart from the wiring board 11 and both the surfaces of them contact the heat conduction resin 23.

In the following, thermal functions of the heat radiation packaging structure for an electric part in accordance with the present embodiment are described.

As the bus bar 12 is made of a relatively thick metallic plate, it is low in electrical resistance and generates a small amount of heat even when a large current supplied to the relays 13, 14, 15 flows through it. Further, the heat generated from each relay 13, 14, 15 is conducted to the portion 19 of the bus bar 12 through a bottom surface of each relay and also to the portions 16, 17, 18 of the bus bar 12 through sides of each relay. The heat conducted through the bus bar 12 is subsequently conducted over the surface of the bus bar to the heat conduction resin 23, and is radiated after reaching a surface of the heat conduction resin 23 or any outer surfaces of the outer case 21. The bus bar 12 is a electrical conductor with low electrical resistance as well as a thermal conductor with high thermal release efficiency due to a large area for heat conduction and/or diffusion together with its high thermal conductivity.

Moreover, since all the surfaces of a package of each relay 13, 14, 15 contacts the heat conduction resin 23, the heat which has arrived at the surface of the package is absorbed efficiently into the heat conduction resin 23. Besides, the sign 24 in FIG. 6 refers to a soldered joint between the bus bar 12 and the connecting lead 15A (13A, 14A), and since the soldered joint 24 is sealed with the heat conduction resin 23, it can be avoided to reach a high temperature because of an excellent heat radiation function. Therefore, degradation of the soldered joint 24 can be restrained.

Moreover, the sign 11A in FIG. 6 refers to the wiring pattern formed on the wiring board 11. Since the wiring pattern 11A is also sealed with the heat conduction resin 23, the heat can be efficiently released. Especially in accordance with the present embodiment, since the bus bar 12 has the thermal diffusion portions 17, 18 which are apart from and parallel to the wiring board 11 by means of the bent portion 12B, heat release efficiency is further enhanced according to heat flow through the portions 17, 18 which contact the heat conduction resin on both sides thereof. Further, since the electric parts, the wiring patterns, etc. are sealed completely in the resin, the electrical insulation can. be maintained at a good level.

Figure 7A:
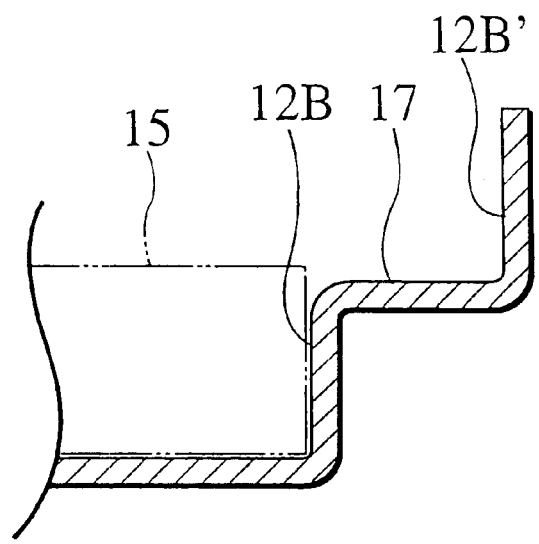
FIGS. 7A and 7B are sectional views showing the modifications of a bus bar in the present embodiment.
Figure 7B:
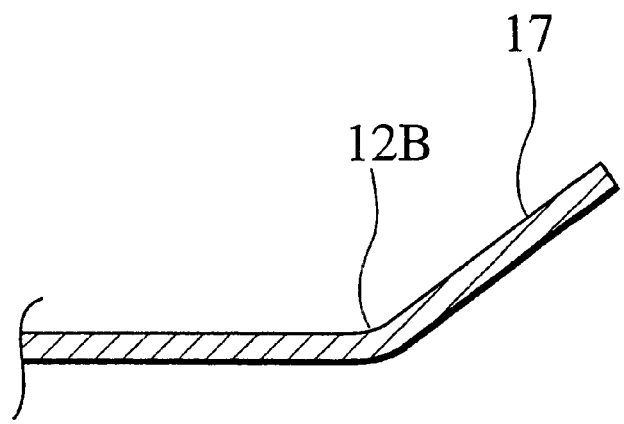

The sectional profile of the thermal diffusion portions 17, 18 of the bus bar 12 can be modified corresponding to a thermal design, and for example, including more bent portions 12B, B' (12A, A') as shown in FIG. 7A, forming the thermal diffusion portion, which is apart from the board by means of the bent portions 12B, B', into such a shape as to extend in the direction non-parallel to the board resulting in enhancement of heat release efficiency as shown in FIG. 7B.

In any one of the above embodiments, the combination of rapid thermal diffusion through the bus bar and effective thermal conduction through the thermal conduction resin from the electric part and the bus bar as a secondary heat source toward the outer case results in high thermal release and/or radiation efficiency.

The present invention is not limited to the embodiments, but a variety of design modifications accompanying the gist of the structure may be possible.

For example, in the above embodiment, sealing is done with a heat conduction resin, but the structure where a highly heat-conductive filler is mixed into the heat ail conduction resin can be adopted. Moreover, the structure where a number of bumps are formed on the surface of the outer case 21 to act as an heat sink can also be adopted.

As it is clear from the foregoing description, according to the first invention, by removing the heat of an exothermic electric part efficiently, the functions to restrain thermal degradation of the electric part, joint degradation of connected portion between the electric part and the bus bar can be provided. Additionally, according to the first invention, there is an effect on restraining the wiring board from getting larger by means of an enhanced heat releasing ability using the heat conduction resin. Further, the functions to enhance humidity resistance and electrical insulation can also be provided by means of sealing the whole electric part with the heat conduction resin.

According to second invention, since the thermal diffusion portion shaped by bending so as to be apart from the wiring board contacts the heat conduction resin on both the surfaces, an area of heat release/radiation can be increased and an effect on enhancing heat radiation can be provided.

According to third invention, since the bent portion contacts the side of the electric part, there is an effect on conducting the heat generated from the electric part well toward the bus bar, restraining the electric part to increase greatly in temperature.

According to the forth invention, an excellent effect on radiating the heat stored in the heat conduction resin outward from the outer case can be achieved.

According to the fifth invention, the heat of an exothermic electric part can be removed efficiently, and the functions to restrain thermal degradation of the electric part, joint degradation of connected portion between the electric part and the bus bar, can be provided. Additionally, it can be restrained for the wiring board to get larger according to an enhanced heat radiating ability using the heat conduction resin and the outer case, and a simple manufacturing can be easily executed at low cost since a sealed structure can be obtained only by filling the heat conduction resin into the outer case.

The embodiments of the present invention are not limited to those described in the present specification, and as obvious to those ordinarily skilled in the art, the present invention is capable of many embodiments and modifications without departing from the spirit and scope thereof. Additionally, these embodiments and modification should be regarded as to be within the technical scope of the present invention on the basis of the claims.

What is claimed is:

1. A heat radiation packaging structure, comprising:
    a wiring board having an upper surface and a lower surface;
    a bus bar disposed on the upper surface of the wiring board, the bus bar comprising:
        a mounting portion contacting the wiring board; and
        at least one thermal diffusion portion connected to the mounting portion and spaced from the wiring board;
    at least one exothermic electric part disposed on the mounting portion of the bus bar; and
    heat conducting resin substantially sealing the upper surface and the lower surface of the wiring board, the mounting portion and the at least one thermal diffusion portion of the bus bar, and the at least one exothermic electric part.

2. The heat radiation packaging structure of claim 1, further comprising:
    a housing supporting the wiring board, wherein the heat conducting resin substantially fills a space between the lower surface of the wiring board and the housing.

3. The heat radiation packaging structure of claim 1, wherein the bus bar further comprises at least one bent portion.

4. The heat radiation packaging structure of claim 3, wherein the at least one thermal diffusion portion is connected to the mounting portion by a respective bent portion.

5. The heat radiation packaging structure of claim 3, wherein the at least one bent portion contacts a side portion of at least one exothermic electric part.

6. A heat radiation packaging structure for at least one exothermic electric part, the packaging structure comprising:
    a housing comprising a plurality of sides and a bottom;
    a wiring board secured in the housing;
    a bus bar disposed on the wiring board, the bus bar comprising:
        a mounting portion contacting the wiring board and supporting the at least one exothermic electric part;
        at least one bent portion connected to the mounting portion and contacting a side portion of at least one exothermic electric part; and
        at least one thermal diffusion portion connected to the mounting portion and spaced from the wiring board; and
    heat conducting resin within the housing substantially sealing the wiring board, the bus bar, the at least one exothermic electric part, and substantially filling a space between the wiring board and the housing bottom.

7. The heat radiation packaging structure of claim 6, wherein the at least one thermal diffusion portion is connected to the mounting portion by a respective bent portion.

8. A heat radiation packaging structure for at least one exothermic electric part, the packaging structure comprising:
    a housing comprising a plurality of sides and a bottom;
    a wiring board secured in the housing;
    a bus bar disposed on the wiring board, the bus bar comprising:
        a mounting portion contacting the wiring board and supporting the at least one exothermic electric part;
        at least one bent portion connected to the mounting portion and contacting a side portion of at least one exothermic electric part; and
        at least one thermal diffusion portion connected to the mounting portion and spaced from the wiring board, wherein the at least one thermal diffusion portion is substantially parallel to the wiring board; and heat conducting resin within the housing substantially sealing the wiring board, the bus bar, the at least one exothermic electric part, and substantially filling a space between the wiring board and the housing bottom.

9. A method of packaging at least one exothermic electric part, the method comprising:

disposing a bus bar on a wiring board, wherein the bus bar comprises:
 a mounting portion contacting the wiring board; and
 at least one thermal diffusion portion connected to the mounting portion and spaced from the wiring board;

securing the at least one exothermic electric part on the mounting portion of the bus bar;

securing the wiring board in a housing; and substantially filling the housing with a heat conducting resin such that the heat conducting resin substantially seals the wiring board and the mounting portion and the at least one thermal diffusion portion of the bus bar.

10. The method of claim 9, wherein the wiring board is secured in the housing at a location spaced from a bottom of the housing.

11. The method of claim 10, wherein substantially filling the housing comprises substantially filling a space between the wiring board and the bottom of the housing.

12. The method of claim 9, wherein the bus bar further comprises at least one bent portion.

13. The method of claim 12, wherein the at least one thermal diffusion portion is connected to the mounting portion by a respective bent portion.

14. The method of claim 12, wherein the at least one bent portion contacts a side portion of at least one exothermic electric part.

* * * * *